73-632

7/7/81

SR

XR 4,277,711

United States Patent [19]

Hanafy

[11] 4,277,711

[45] Jul. 7, 1981

[54] ACOUSTIC ELECTRIC TRANSDUCER WITH SHIELD OF CONTROLLED THICKNESS

[75] Inventor: Amin M. Hanafy, Andover, Mass.

[73] Assignee: Hewlett-Packard Company, Palo Alto, Calif.

[21] Appl. No.: 83,692

[22] Filed: Oct. 11, 1979

[51] Int. Cl.³ .............................................. H01L 41/08

[52] U.S. Cl. .................................... 310/334; 310/336; 128/660; 73/632

[58] Field of Search ................................ 310/334-337, 310/327; 73/632, 642, 644; 128/600

[56] References Cited

U.S. PATENT DOCUMENTS

| | | | |
|---|---|---|---|
| 4,101,795 | 7/1978 | Fukumoto et al. | 310/336 |
| 4,211,948 | 7/1980 | Smith et al. | 310/334 X |
| 4,217,516 | 8/1980 | Iinuma et al. | 310/335 |
| 4,217,684 | 8/1980 | Brisken et al. | 310/334 X |

*Primary Examiner*—Mark O. Budd
*Attorney, Agent, or Firm*—Donald N. Timbie

[57] ABSTRACT

The rate of decay of oscillations caused by application of driving pulses to the spaced crystals of an acoustic electric transducer that are mounted on a base is increased by making the thickness of the shield in contact with the ends of the crystals remote from the base such that asymmetrical Lamb waves flowing along the shield that can induce crystal oscillations in the thickness mode have a wavelength equal to twice the spacing between crystals so that their integrated effect is nearly zero.

1 Claim, 6 Drawing Figures

ACOUSTIC ELECTRIC TRANSDUCER WITH SHIELD OF CONTROLLED THICKNESS

BACKGROUND OF THE INVENTION

This invention relates to an improvement in acoustic electrical transducers used in instruments for forming images from reflections of energy contained in acoustic pulses transmitted into the matter being examined. Transducers for this purpose may be comprised of a plurality of rectilinear piezoelectric crystals mounted in spaced parallel relationship on an acoustic energy absorbing base, a grounded shield of thin metal in electrical contact with the ends of the crystals remote from the base, and electrodes in the form of thin metal strips respectively in contact with each crystal so as to cause them to have oscillatory changes in dimension at a desired carrier frequency $F_C$ in a direction perpendicular to the base when a driving voltage pulse is applied thereto. The resulting motion of the ends of the crystals remote from the base causes pulses of acoustic waves of the carrier frequency $F_C$ to pass through a shield that is in contact with the ends of the crystals and into matter in contact with the shield. When reflections of energy from these acoustic pulses arrive at the crystals, they experience an oscillatory change in dimension in the same direction as before but at an amplitude determined by the energy in the reflected pulses. The electrical signals produced at the electrodes as a result of the oscillatory changes in dimension are summed to produce a signal for controlling the intensity of an image. It is often required, as for example when viewing a carotid artery or the heart of an infant, that the instrument be capable of forming images having a very small minimum range. Unfortunately, however, oscillations produced in the crystals by the driving pulses decay at such a slow rate as to produce electrical signals at the electrodes having amplitudes sufficient to mask the signals produced at the electrodes by reflections from nearby targets. In my U.S. patent application, Ser. No. 083,693, filed on Oct. 11, 1979, and entitled "Acoustic Electric Transducer with Slotted Base", which is filed concurrently herewith, I describe a way of increasing the rate of decay of such oscillations by attenuating the Rayleigh waves traveling along the surface of the base with slots in the base that are aligned with the spaces between the crystals.

BRIEF DISCUSSION OF THE INVENTION

Whereas the provision of the slots just referred to is effective, I have found that the motion of the end of each crystal at the frequency $F_C$ of the transmitted acoustic waves induces asymmetric Lamb waves of the same frequency to flow in opposite directions along the shield and excite the other crystals into thickness mode oscillations by mode conversion. The oscillations induced by the Lamb wave do not continue as long as those induced by the Rayleigh waves because they have a higher frequency and travel to the end of the shield in less time, but they produce waves at the crystal electrodes of sufficient amplitude to mask the voltages produced thereat by the acoustic waves reflected from nearby points. This effect is reduced in accordance with this invention by making the thickness of the metal shield such that one wavelength of the Lamb wave equals twice the center-to-center spacing of the crystals. This causes the integrated effect of the Lamb wave to be zero.

DETAILED DESCRIPTION OF THE DRAWINGS

Figure 1:
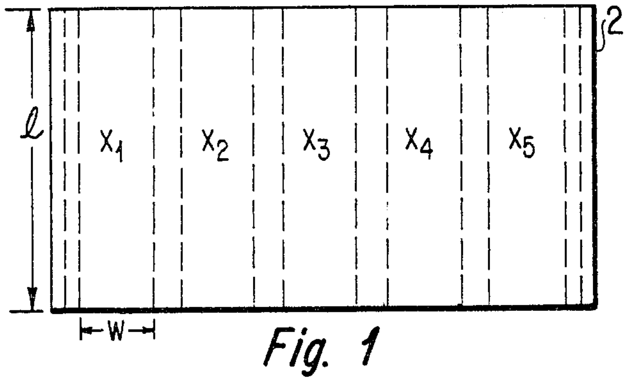
FIG. 1 is a top view of transducers of various construction.

FIG. 1 is a top view of a thin metal shield 2 that is generally used with transducers having an array of piezoelectric crystals. In the construction illustrated in FIG. 1A, which is an elevation of FIG. 1, the tops of a plurality of crystals $X_{1-5}$ are in electrical contact with the underside of the shield 2, and the bottoms are respectively in electrical contact with metal strips $s_{1-5}$ that are in turn attached to an insulating layer 4 mounted on a conductive base 5. Thus, the crystals $X_{1-5}$ are effectively mounted on the base 5. The function of the base 5 is to provide an acoustical impedance match with the insulating layer 4, the strips $s_{1-5}$ and the crystals $X_{1-5}$ and to absorb acoustical energy resulting from oscillation of the crystals $X_{1-5}$. Each of the crystals $X_{1-5}$ has a thickness h, a width w and a length l, and they are mounted with their lengths parallel and spaced from each other. In the interest of clarity of illustration, the number of crystals shown is far less than are usually used and their dimensions are exaggerated. By way of example, the length l might be one centimeter, the thickness h might be 0.05 cm, the width w might be 0.02 cm and the spacing between the longitudinal centers of the crystals might be 0.03 cm. Leads $L_{1-5}$ are respectively connected to the metal strips $s_{1-5}$ and encased in a conductive sheath 6 that is connected to ground, as are the shield 2 and the base 5.

The acoustic pulse that is to be transmitted into a patient's body in contact with the grounded shield 2 is generated by applying pulses of voltage across the thickness of the crystals $X_{1-5}$ via the leads $L_{1-5}$ respectively. As is well known, the wavefront of the acoustic pulses emanating from the tops of the crystals $X_{1-5}$ can be made to have a desired direction by controlling the times at which the voltage pulses are respectively applied to the crystals $X_{1-5}$.

Although various forms of firing pulses may be used, it is customary to employ one or two cycles of a frequency $F_C$ at which the crystals resonate in the thickness mode. The bandwidth of the crystal system is such that a small number of high amplitude cycles of the frequency $F_C$ are radiated into the body. A portion of the vertical component of this oscillation is transmitted into the base 5 and absorbed. Owing to the bandwidth of the crystals $X_{1-5}$ and the frequency content of the excitation pulse, the crystals also oscillate in other modes by mode conversion. Width mode oscillations having a higher frequency $F_W$ determined by the width w of the crystals are produced in a horizontal direction along the surface of the base 5, but they cause no great difficulty because the system filters them out and because they are readily absorbed by the backing. As discussed in my U.S. patent application previously referred to, the crystals also oscillate in a length mode as a result of mode conversion so as to generate Rayleigh waves in the surface of the base 5 that induce thickness mode oscillations in the crystals at the frequency $F_C$ as the Rayleigh wave passes by their bases.

Figure 1A:
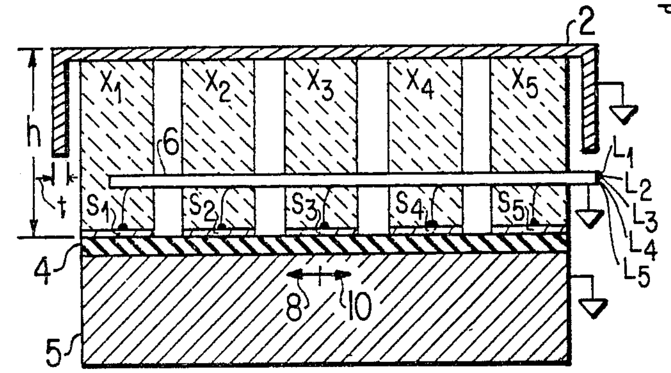
FIGS. 1A, 1B and 1C are elevations of FIG. 1, each showing transducers of different construction to which the invention of this application is applied and each having cross-sectioning indicating the materials involved.
Figure 1B:
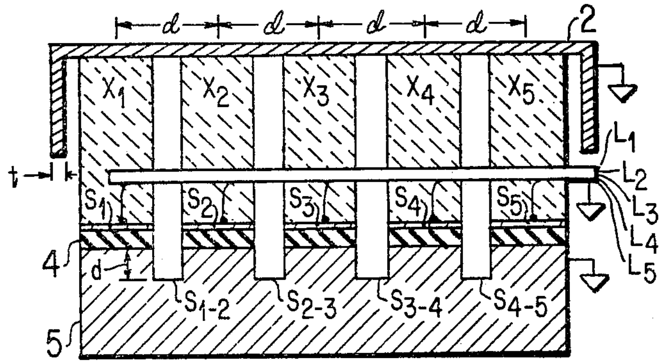

FIG. 1B illustrates a transducer constructed in accordance with my aforesaid patent application wherein slots $S_{1-2}$, $S_{2-3}$, $S_{3-4}$ and $S_{4-5}$ are formed in the base 5 in alignment with the spaces between the crystals $X_{1-5}$. The crystals are mounted on the base 5 as previously described.

Figure 1C:
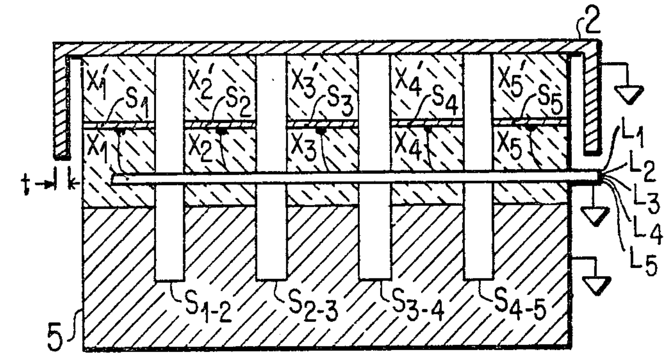

FIG. 1C illustrates a transducer constructed in accordance with my aforesaid application and a U.S. patent application, Ser. No. 020,007, filed on Mar. 12, 1979, in the name of John D. Larson III, and entitled "Apparatus and Method for Suppressing Mass/Spring Mode in Acoustic Imaging Transducers", wherein the electrode strips $s_{1-5}$ are inserted between the crystals $X_1$ and $X_1'$, $X_2$ and $X_2'$, $X_3$ and $X_3'$, $X_4$ and $X_4'$, and $X_5$ and $X_5'$. As the shield 2 and the base 5 may both be grounded in this configuration, no insulating layer 4 is provided. The crystals are therefore mounted directly on the base 5.

Figure 2:
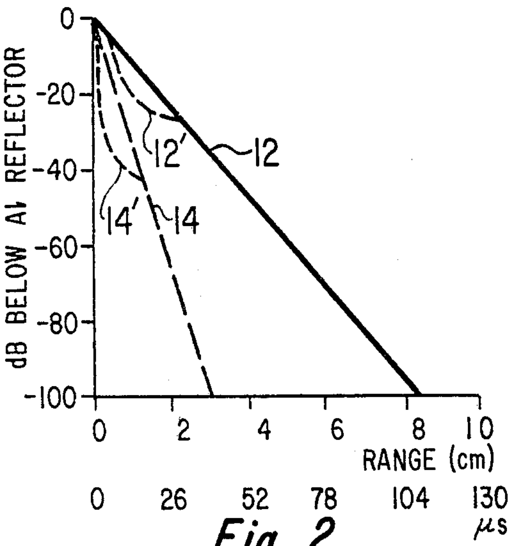
FIG. 2 is a graph illustrating the operational results of the invention.

Graph 12 of FIG. 2 illustrates the slow rate of decay of the thickness mode oscillations of the crystals in a prior art transducer such as shown in FIG. 1A, and graph 14 illustrates the more rapid decay of these oscillations effected by the slots $S_{1-2}$, $S_{2-3}$, $S_{3-4}$ and $S_{4-5}$ provided in accordance with my other patent application. The graphs 12 and 14 include the effects of both Lamb and Rayleigh waves. Graphs 12' and 14' respectively illustrate the increased rate of decay in thickness mode oscillations of the crystals $X_{1-5}$ achieved by selecting the thickness of the shield 2 in accordance with this invention in transducers such as shown in FIGS. 1A, 1B and 1C. It will be noted that the increase in the rate of decay brought about by the present invention is effective for only a portion of the time it takes for all thickness mode oscillations to decrease by 100 db. This is because the Lamb waves, being of a higher frequency $F_L$ than the frequency $F_R$ of the Rayleigh waves, traverse the shield 2 with greater velocity than the Rayleigh waves traverse the base 5. Although the attenuation of the effects of the Lamb waves has little effect on the total time for all thickness mode oscillations to decrease by 100 db, it has a marked effect in a practical case where the weakest reflected acoustic wave to which the system is responsive is 20 or 30 db below the energy level of a fully reflected transmitted acoustic wave. It should be noted that this discussion relates to asymmetrical Lamb waves in which all points in the shield 2 along respective lines perpendicular to it move up and down together and not to a symmetrical Lamb wave wherein the points on opposite sides of the center of thickness of the shield move in opposite directions.

Figure 3:
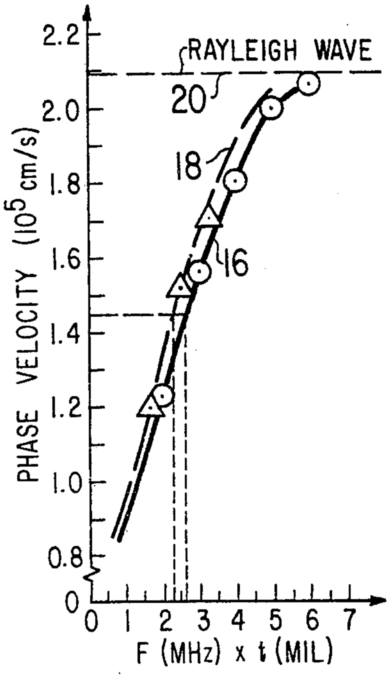
FIG. 3 is a graph illustrating the relationship between the phase velocity of acoustic waves in a sheet of metal and the product of the frequency of the waves and the thickness of the sheet.

Reference is now made to FIG. 3 which contains graphs 16 and 18 that respectively illustrate the velocities of Lamb waves in cm/sec obtained theoretically and experimentally as a function of the product of the thickness of the shield 2 in mils and the frequency of the waves in MHz. The graph 20 represents the velocity of the Rayleigh waves in a shield thicker than one wavelength. As the product of shield thickness and the Lamb wave frequency is increased, the velocity of the Lamb waves increases until it is the same as that of the Rayleigh waves at product value of about 6. The desired phase velocity C is such that one wavelength $\lambda_C$ of the carrier frequency $F_C$ of the Lamb wave in the shield 2 equals twice the spacing d between the centers of the crystals $X_{1-5}$ as shown in FIG. 1B, or $$d=\lambda_C/2 \qquad (1)$$

and since $$C=\lambda_C F \qquad (2)$$

by substitution of (1) in (2) we obtain $$C=2dF \qquad (3)$$

With C determined, FIG. 3 can be used to determine the product of shield thickness t in mils and the carrier frequency $F_C$, and knowing $F_C$, the thickness t of the shield in mils that is required can be calculated. With the transducer dimensions as previously set forth, the phase velocity C is $1.9\times10^5$ cm/sec. The coordinate of this value is between 2.3 and 2.6 depending on which graph is used, or approximately 2.5 on the abcissa, and if $F_C$ equals 2.5 MHz, the thickness will be $$2.5/2.5=1 \text{ mil.}$$

What is claimed is:

1. An acoustic electric transducer, comprising a base, a plurality of piezoelectric crystals mounted on said base in spaced parallel relationship with a given center-to-center spacing, electrode means respectively in contact with each of said crystals so as to cause said crystals to have oscillatory changes in dimension at a frequency $F_C$ in a direction perpendicular to the said base when driving voltage pulses are applied thereto, and a metal shield mounted in electrical contact with the ends of said crystals that are opposite to said base, the thickness of said metal shield being such as to cause the asymmetric Lamb waves produced in said shield by said oscillatory changes in dimension of said crystals to have a wavelength in said shield that is twice the center-to-center spacing of said crystals.

* * * * *